(12) United States Patent
Mathias et al.

(10) Patent No.: US 10,811,713 B2
(45) Date of Patent: *Oct. 20, 2020

(54) METHOD OF MANUFACTURING AN INTEGRATED WATER VAPOR TRANSFER DEVICE AND FUEL CELL

(71) Applicant: GM GLOBAL TECHNOLOGY OPERATIONS LLC, Detroit, MI (US)

(72) Inventors: Mark F. Mathias, Rochester Hills, MI (US); Balasubramanian Lakshmanan, Rochester Hills, MI (US); Swaminatha P. Kumaraguru, Rochester Hills, MI (US); Scott C. Moose, Linden, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 331 days.

This patent is subject to a terminal disclaimer.

(21) Appl. No.: 15/882,275

(22) Filed: Jan. 29, 2018

(65) Prior Publication Data

US 2019/0237787 A1 Aug. 1, 2019

(51) Int. Cl.
*H01M 8/1004* (2016.01)
*H01M 8/04119* (2016.01)
*H01M 4/88* (2006.01)
*H01M 8/0245* (2016.01)
*H01M 8/04089* (2016.01)
*H01L 21/56* (2006.01)

(52) U.S. Cl.
CPC .......... *H01M 8/1004* (2013.01); *H01L 21/56* (2013.01); *H01M 4/8807* (2013.01); *H01M 8/0245* (2013.01); *H01M 8/04089* (2013.01); *H01M 8/04126* (2013.01)

(58) Field of Classification Search
None
See application file for complete search history.

(56) References Cited

U.S. PATENT DOCUMENTS

| | | | | |
|---|---|---|---|---|
| 6,500,217 | B1 * | 12/2002 | Starz | B41M 1/26 29/623.5 |
| 2006/0105227 | A1 * | 5/2006 | Kim | H01M 4/8605 429/483 |
| 2009/0181276 | A1 * | 7/2009 | Beutel | H01M 8/1069 429/480 |
| 2011/0053037 | A1 * | 3/2011 | MacKinnon | H01M 8/1027 429/483 |
| 2011/0143254 | A1 * | 6/2011 | Kongkanand | H01M 4/861 429/483 |

(Continued)

*Primary Examiner* — Rena Dye Cronin
(74) *Attorney, Agent, or Firm* — Quinn IP Law

(57) ABSTRACT

The present disclosure provides a method for manufacturing an integrated MEA, the method includes the following steps: (1) providing a substrate having an AA region and a WVT region; (2) coating a hydrophobic microporous layer across the substrate; (3) coating a catalyst layer onto the hydrophobic microporous layer in the AA region; (4) coating a first fuel cell membrane ionomer layer onto the catalyst layer in the AA region and onto the hydrophobic microporous layer in the WVT region; (5) optionally applying a membrane support layer to the first fuel cell membrane ionomer layer in the AA region and the WVT region; (6) optionally applying a coating of second fuel cell membrane ionomer layer thereby forming a coated substrate; and (7) assembling the coated substrate to a companion coated substrate.

25 Claims, 12 Drawing Sheets

(56) References Cited

U.S. PATENT DOCUMENTS

| | | | |
|---|---|---|---|
| 2011/0217613 A1* | 9/2011 | Rea | H01M 8/04 |
| | | | 429/432 |
| 2011/0239747 A1* | 10/2011 | Zhang | H01M 4/0471 |
| | | | 73/64.44 |
| 2014/0261982 A1* | 9/2014 | Moose | H01M 8/1004 |
| | | | 156/182 |
| 2015/0004467 A1* | 1/2015 | Kim | H01M 2/18 |
| | | | 429/145 |

* cited by examiner

METHOD OF MANUFACTURING AN INTEGRATED WATER VAPOR TRANSFER DEVICE AND FUEL CELL

TECHNICAL FIELD

The invention relates to a method of manufacturing an integrated membrane electrode assembly (MEA) having a water vapor transfer (WVT) region.

BACKGROUND

Fuel cell stack systems are used as power sources for electric vehicles, stationary power supplies, and other applications. One known fuel cell stack system is the proton exchange membrane (PEM) fuel cell stack system that includes a membrane electrode assembly (MEA) comprising a thin, solid polymer electrolyte membrane having an anode on one face and a cathode on the opposite face. The MEA is sandwiched between a pair of electrically conductive contact elements which serve as current collectors for the anode and cathode, which may contain appropriate channels and openings therein for distributing the fuel cell stack system's gaseous reactants (i.e., H2 and O2 or air) over the surfaces of the respective anode and cathode.

PEM fuel cells comprise a plurality of the MEAs stacked together in electrical series while being separated by an impermeable, electrically conductive contact element known as a bipolar plate or current collector. The fuel cell stack systems are operated in a manner that maintains the MEAs in a humidified state. The level of humidity of the MEAs affects the performance of the fuel cell stack system. Additionally, if an MEA is operated too dry, the performance and useful life of the MEA can be reduced. To avoid drying out the MEAs, the typical fuel cell stack systems are operated with the MEA at a desired humidity level, wherein liquid water is formed in the fuel cell during the production of electricity. Additionally, the cathode and anode reactant gases being supplied to the fuel cell stack system are also humidified to prevent the drying of the MEAs in the locations proximate the inlets for the reactant gases. Traditionally, a water vapor transfer (WVT) unit is utilized to humidify the cathode reactant gas prior to entering into the fuel cell. See, for example, U.S. Pat. No. 7,138,197 by Forte et al., incorporated herein by referenced in its entirety, a method of operating a fuel cell stack system.

The basic components of a PEM-type fuel cell are two electrodes separated by a polymer membrane electrolyte. Each electrode is positioned on opposite sides of the membrane as a thin catalyst layer. Similarly, on each side of the assembly adjacent to each thin catalyst layer, a microporous layer (MPL) is coated on a gas diffusion substrate to produce a gas diffusion layer (GDL) is provided, the gas diffusion layer being the outermost layer on each side of the membrane electrode assembly (MEA). The gas diffusion substrate is commonly composed of non-woven carbon fiber paper or woven carbon cloth. The GDL is primarily provided to enable conductivity, and to allow gases to come in contact with the catalyst through the GDL pores. The GDL works as a support for the catalyst layer, provides good mechanical strength and easy gas access to the catalyst and provides the electrical conductivity. The purpose of the microporous layer is to minimize the contact resistance between the GDL and catalyst layer, limit the loss of catalyst to the GDL interior and help to improve water management as it provides effective water transport. Accordingly, the electrodes (catalyst layers), membrane, microporous layers, and gas diffusion layer together form the membrane electrode assembly (MEA). The MEA is generally disposed between two bipolar plates to form a fuel cell arrangement.

As is known, hydrogen is supplied to the fuel cells in a fuel cell stack to cause the necessary chemical reaction to power the vehicle using electricity. One of the byproducts of this chemical reaction in a traditional fuel cell is water in the form of vapor and/or liquid. It is also desirable to provide humid air as an input to the fuel cell stack to maximize the performance output for a given fuel cell stack size. Humid air also prevents premature mechanical and chemical degradation of the fuel cell membrane.

The input air is typically supplied by a compressor while a water transfer device external to the stack is traditionally implemented in a fuel cell system to add moisture to the input air supplied by a compressor, the source of the moisture often coming from the product-water-laden stack cathode outlet stream. These components among many other components in a traditional fuel cell system contribute to the cost of the fuel cell system and also require packaging space. In many applications, such as but not limited to a vehicle, packaging space is limited.

Accordingly, there is a need to integrate components of a fuel cell system where possible at a reasonable cost.

SUMMARY

The present disclosure provides a method for manufacturing an MEA with an integrated WVT region. The method includes the steps of: (1) providing a substrate having an active area (AA) region and a water vapor transfer (WVT) region; (2) coating a hydrophobic microporous layer across the substrate; (3) coating a catalyst layer onto the hydrophobic microporous layer in the AA region; (4) coating a first fuel cell membrane ionomer layer onto the catalyst layer in the AA region and onto the hydrophobic microporous layer in the WVT region; (5) optionally applying a membrane support layer to the first fuel cell membrane ionomer layer in the AA region and the WVT region; (6) optionally applying a coating of a second fuel cell membrane ionomer layer thereby forming a coated substrate; and (7) assembling the coated substrate to a companion coated substrate. The coated substrate may be heat treated before assembling the coated substrate to a companion coated substrate. Therefore, it is understood that coated substrate may be formed upon applying the first fuel cell membrane ionomer layer. However, as another option, the membrane support layer may be applied to the first fuel cell membrane ionomer layer thereby forming a coated substrate. Also, in yet a third option, the second fuel cell membrane ionomer may be applied on top of the membrane support layer thereby forming a coated substrate.

The AA region of the coated substrate may include a substrate layer, the hydrophobic MPL layer, the catalyst layer, the first fuel cell membrane ionomer layer, the optional membrane support layer, and the optional second fuel cell membrane ionomer. The WVT region of the coated substrate includes a substrate layer, the hydrophobic MPL layer, the first fuel cell membrane ionomer layer, the optional membrane support layer, and the optional second fuel cell membrane ionomer. The WVT region may be defined at a first end of the substrate. The WVT region may also be defined at the first end of the substrate and at the second end of the substrate with the AA region disposed therebetween.

In another embodiment of the present disclosure, the method of manufacturing a fuel cell having an integrated water vapor transfer region may involve stripe coating certain layers of the fuel cell. In this embodiment, the manufacturing method includes the steps of: (1) providing a substrate having an AA region and a WVT region; (2) coating a hydrophobic microporous layer across the substrate; (3) stripe coating a catalyst layer onto the hydrophobic microporous layer in the AA region and a mixed carbon/ionomer layer in the WVT region; (4) coating a first fuel cell membrane ionomer layer onto the catalyst layer in the AA region and onto the mixed carbon/ionomer layer in the WVT region; (5) optionally applying a membrane support layer to the first fuel cell membrane ionomer layer in the AA region and the WVT region; (6) optionally applying a coating of a second fuel cell membrane ionomer layer thereby forming a coated substrate; and (7) assembling the coated substrate to a companion coated substrate. The coated substrate of the aforementioned method may be heat-treated before assembling the coated substrate to a companion coated substrate. Therefore, it is understood that coated substrate may be formed upon applying the first fuel cell membrane ionomer layer. However, as another option, the membrane support layer may be applied to the first fuel cell membrane ionomer layer thereby forming a coated substrate. Also, in yet a third option, the second fuel cell membrane ionomer layer may be applied on top of the membrane support layer thereby forming a coated substrate.

The AA region of the coated substrate may include a substrate layer, the hydrophobic MPL layer, the catalyst layer, the first fuel cell membrane ionomer layer, the optional membrane support layer, and the optional second fuel cell membrane ionomer. In contrast, the WVT region of the coated substrate includes a substrate layer, the hydrophobic MPL layer, an optional mixed carbon/ionomer layer, the first fuel cell membrane ionomer layer, the optional membrane support layer, and the optional second fuel cell membrane ionomer. The WVT region may be defined at a first end of the coated substrate while the AA region being defined across the remainder of the coated substrate. Alternatively, the WVT region may be defined at the first end of the substrate and at a second end of the substrate with the AA region disposed therebetween.

In yet another embodiment of the present disclosure, the method of manufacturing a fuel cell having an integrated water vapor transfer region may involve stripe coating multiple layers of the fuel cell. In this embodiment, the manufacturing method includes the steps of: (1) providing a substrate having an AA region and a WVT region; (2) stripe coating a hydrophobic microporous layer in the AA region and a hydrophilic microporous layer in the WVT region; (3) stripe coating a catalyst layer onto the hydrophobic microporous layer in the AA region and a carbon/ionomer layer in the WVT region; (4) stripe coating a first fuel cell membrane ionomer layer onto the catalyst layer in the AA region and a first WVT ionomer onto the carbon/ionomer layer in the WVT region; (5) applying an optional membrane support layer; (6) optionally applying a stripe coated second fuel cell membrane ionomer layer in the AA region and an optional second WVT ionomer in the WVT region; and (7) assembling the coated substrate to a companion coated substrate. Therefore, it is understood that coated substrate may be formed upon applying the first fuel cell membrane ionomer layer. However, as another option, the membrane support layer may be applied to the first fuel cell membrane ionomer layer thereby forming a coated substrate. Also, in yet a third option, the second fuel cell membrane ionomer may be applied on top of the membrane support layer thereby forming a coated substrate.

The substrate may be a gas diffusion media. Moreover, the coated substrate of the aforementioned manufacturing method may be heat treated before assembling the coated substrate to a companion coated substrate. The AA region of the coated substrate may include a substrate layer, the hydrophobic MPL layer, the catalyst layer, the first fuel cell membrane ionomer layer, the optional membrane support layer, and the optional second fuel cell membrane ionomer. In contrast, the WVT region of the coated substrate includes a substrate layer, the hydrophobic MPL layer, the optional carbon/ionomer layer, the first WVT ionomer layer, the optional membrane support layer, and the optional second WVT ionomer layer. In one embodiment, the WVT region may be defined at a first end of the substrate and the AA region may be defined across the remainder of the coated substrate. In another embodiment, the WVT region may be defined at the first end of the substrate and at a second end of the substrate with the AA region disposed therebetween.

The present disclosure and its particular features and advantages will become more apparent from the following detailed description considered with reference to the accompanying drawings.

BRIEF DESCRIPTION OF THE DRAWINGS

These and other features and advantages of the present disclosure will be apparent from the following detailed description, best mode, claims, and accompanying drawings in which:

Like reference numerals refer to like parts throughout the description of several views of the drawings.

DETAILED DESCRIPTION

Figure 1:
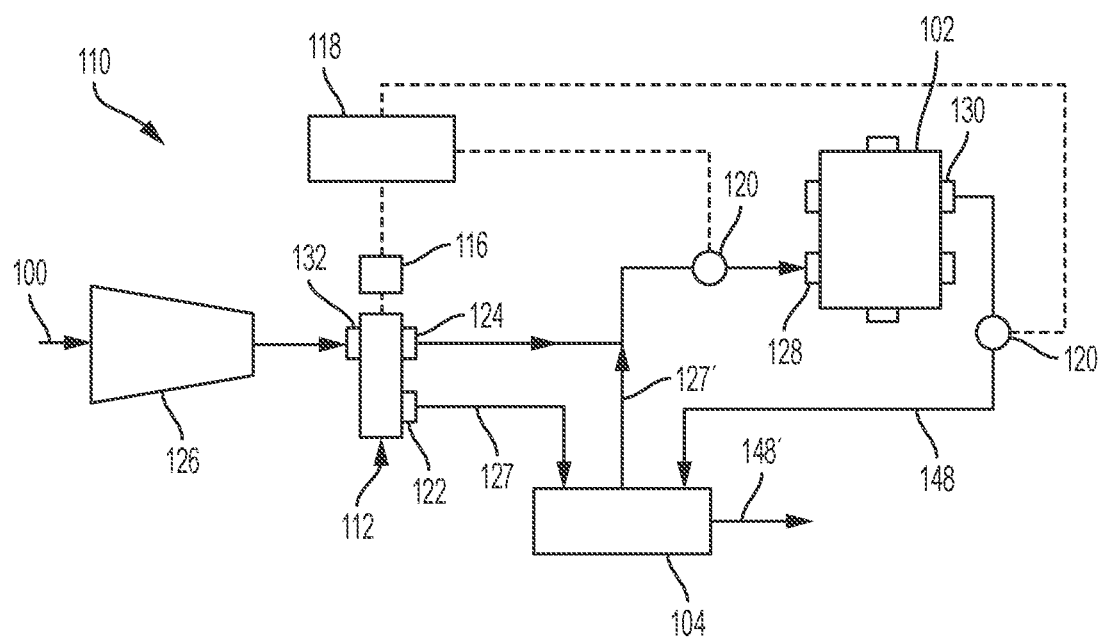
FIG. 1 is an example schematic diagram of a traditional fuel cell system.

Reference will now be made in detail to presently preferred compositions, embodiments and methods of the present disclosure, which constitute the best modes of practicing the present disclosure presently known to the inventors. The figures are not necessarily to scale. However, it is to be understood that the disclosed embodiments are merely exemplary of the present disclosure that may be embodied in various and alternative forms. Therefore, specific details disclosed herein are not to be interpreted as limiting, but merely as a representative basis for any aspect of the present disclosure and/or as a representative basis for teaching one skilled in the art to variously employ the present disclosure.

Except in the examples, or where otherwise expressly indicated, all numerical quantities in this description indicating amounts of material or conditions of reaction and/or use are to be understood as modified by the word "about" in describing the broadest scope of the present disclosure. Practice within the numerical limits stated is generally preferred. Also, unless expressly stated to the contrary: percent, "parts of," and ratio values are by weight; the description of a group or class of materials as suitable or preferred for a given purpose in connection with the present disclosure implies that mixtures of any two or more of the members of the group or class are equally suitable or preferred; the first definition of an acronym or other abbreviation applies to all subsequent uses herein of the same abbreviation and applies to normal grammatical variations of the initially defined abbreviation; and, unless expressly stated to the contrary, measurement of a property is determined by the same technique as previously or later referenced for the same property.

It is also to be understood that this present disclosure is not limited to the specific embodiments and methods described below, as specific components and/or conditions may, of course, vary. Furthermore, the terminology used herein is used only for the purpose of describing particular embodiments of the present disclosure and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, un-recited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

The terms "comprising", "consisting of", and "consisting essentially of" can be alternatively used. Where one of these three terms is used, the presently disclosed and claimed subject matter can include the use of either of the other two terms.

Throughout this application, where publications are referenced, the disclosures of these publications in their entireties are hereby incorporated by reference into this application to more fully describe the state of the art to which this present disclosure pertains.

FIG. 1 shows a schematic cathode subsystem of a fuel cell system 110 known in the art. As shown, the typical water vapor transfer (WVT) device 104 is located away from a cathode outlet 130 and a cathode inlet 128 of the fuel cell stack of the fuel cell stack system. The traditional fuel cell system may, but not necessarily, include a charge air cooler (CAC) and/or diverter 112 together with the water vapor transfer device 104 (such as a humidifier) to regulate a relative humidity of the fuel cell 102. The charge air cooler and/or diverter 112 may have the first inlet 132, the first outlet 124, and the second outlet 122. The traditional fuel cell system may further include the fuel cell 102 and an air compressor 126 as shown. The fuel cell 102 has a plurality of fuel cells, a cathode inlet 128, and a cathode outlet 130. The air compressor 126 is in fluid communication with the fuel cell 102 and adapted to provide a flow of charged air thereto. The WVT device 104 is generally an external component to the fuel cell stack and the WVT device 104 is in fluid communication with the air compressor 126 and the fuel cell 102 as shown. The WVT device 104 is adapted to selectively humidify the charged air provided to the fuel cell 102. The WVT device 104 may transfer moisture to the input charged air 127 (coming from the compressor 126) from the moist cathode exhaust stream 148 exiting the cathode outlet 130 via a membrane (not shown). Thus, the output charged air 127' from the WVT device has sufficient humidity for use in the fuel cell 102. Other suitable means for humidifying the charged air may also be employed.

The optional charge air cooler (and/or diverter) 112 is disposed in communication with the air compressor 126 and each of the fuel cell 102 and the WVT device 104. The first inlet 132 is in fluid communication with the air compressor 126. The first outlet 124 is in fluid communication with the fuel cell 102. The air compressor 126 draws in ambient air 100 and is in fluid communication with the WVT device 104 (via optional CAC and/or diverter 112). The second outlet 122 is in fluid communication with the WVT device 104. The charge air cooler (and/or three-way diverter) shown as element 112 is adapted to: a) cause charged air to bypass the WVT device 104 and flow to the fuel cell 102; and/or b) cause charged air to flow to the WVT device 104—to regulate the humidity of the fuel cell 102.

The example known fuel system of FIG. 1 may include the actuator 116, the controller 118, and at least one humidity sensor 120. The fuel cell system controller 118 may be in electrical communication with the actuator 116. The controller 118 regulates the humidity of the fuel cell 102 via actuator and/or WVT. A humidity sensor 120 may be provided in electrical communication with the controller in order to provide feedback of the charged air relative humidity to the controller 118. However, it is noted that more commonly known fuel cell systems eliminate the use of humidity sensors and instead use the high frequency (i.e. membrane) resistance of the stack to indirectly measure the moisture in the system. Nonetheless, regardless of whether humidity sensors are implemented, many fuel cell systems generally implement an external WVT device 104 as shown which requires space and thus increases the overall size of the fuel cell system. Packaging space for a fuel cell system can be particularly restrictive in applications such as, but not limited to vehicles. Thus, it is desirable to reduce the volume of such fuel cell systems especially in vehicle applications.

Figure 2:
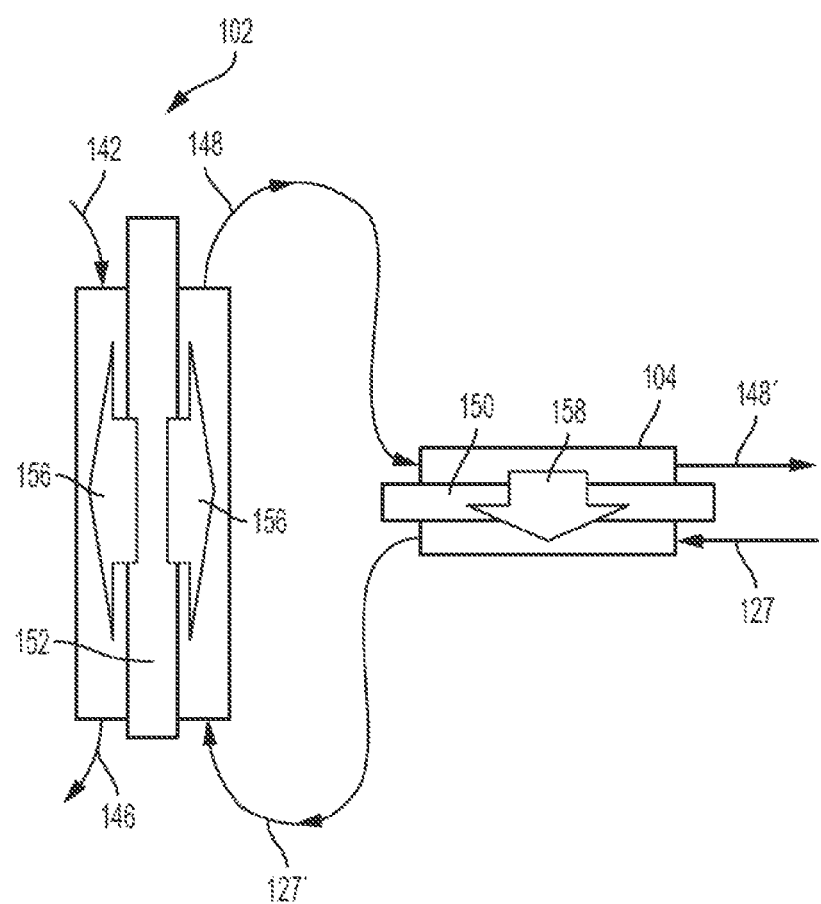
FIG. 2 is a schematic diagram of a traditional water vapor transfer unit which is external to a fuel cell in a fuel cell stack.

FIG. 2 shows a more detailed schematic of a traditional fuel cell and external water vapor transfer device. Input charged air 127 from the compressor 126 (and/or optionally CAC & Diverter 112) enters the WVT device 104. The WVT membrane 150 is configured to transfer moisture 158 from the moist cathode exhaust gas stream 148 thereby creating humidified output charged air 127' to enter the fuel cell 102 at the cathode inlet 128 (see FIG. 1). The cathode exhaust stream 148 exits the fuel cell 102 as moisture rich air due to the water byproduct 156 from the reaction on the MEA 152 in the fuel cell 102. It is understood that after passing through the WVT device 104, the cathode exhaust stream 148' has a reduced moisture content.

Figure 3:
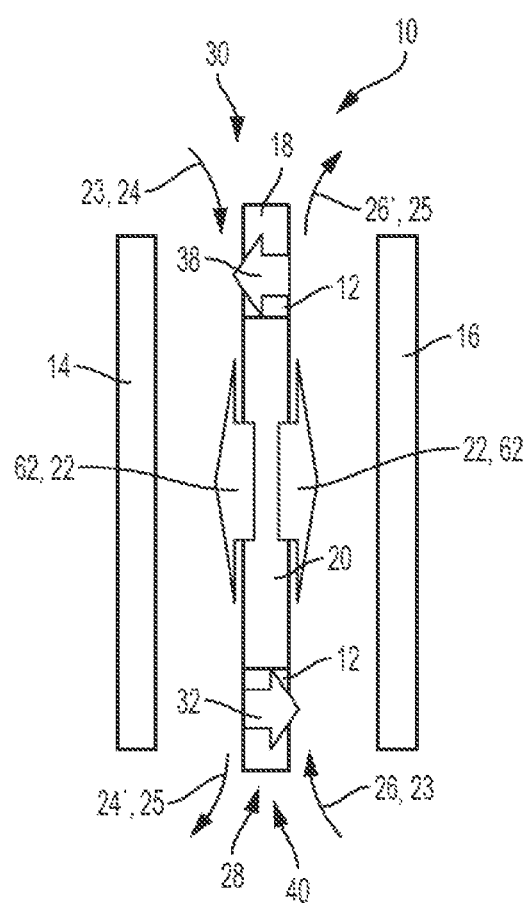
FIG. 3 is a schematic diagram of an example side view of an expanded fuel cell with the integrated membrane electrode assembly.
Figure 4:
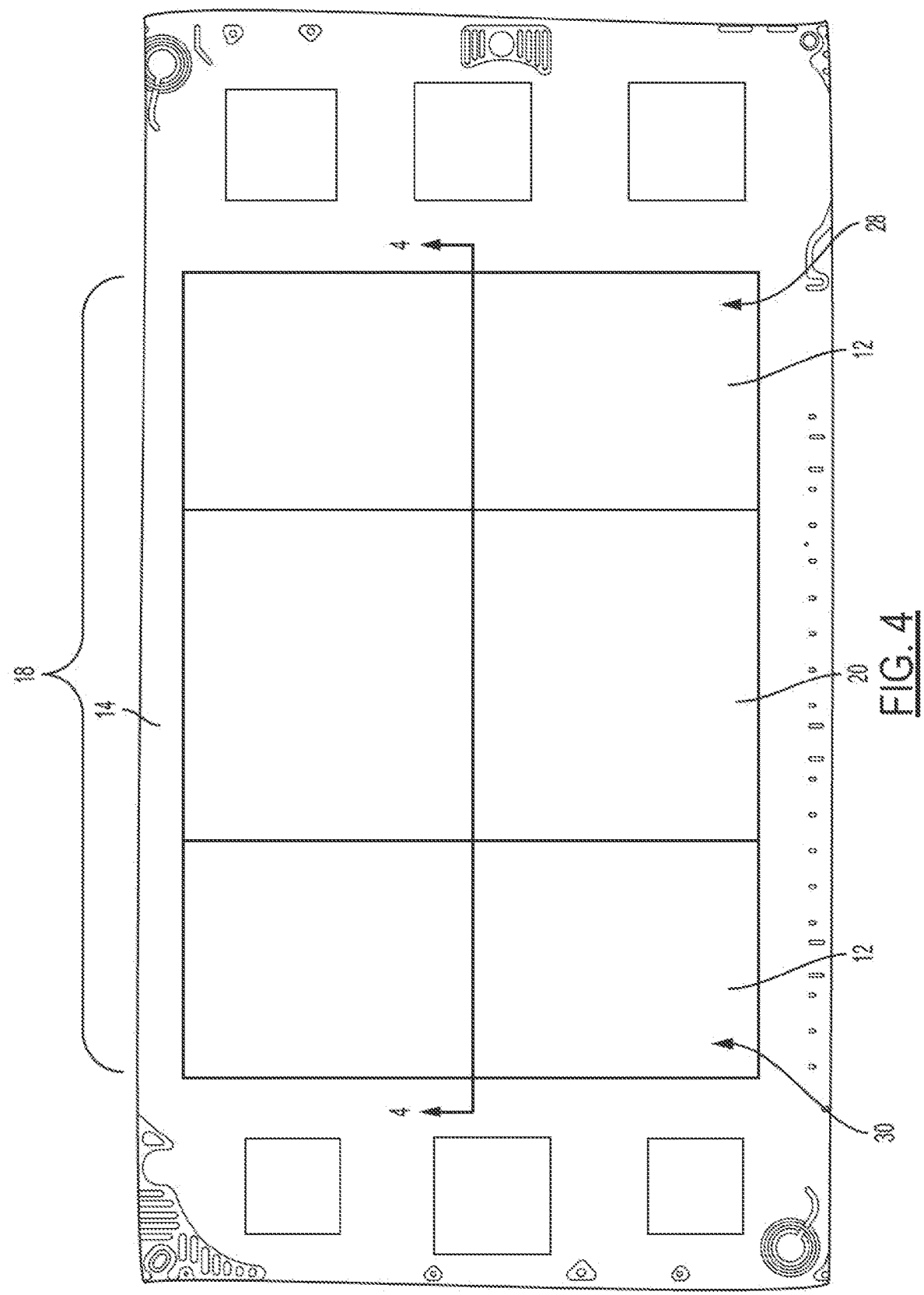
FIG. 4 is a diagram of a first example front view of a fuel cell with the integrated membrane electrode assembly disposed onto a first bipolar plate.
Figure 5:
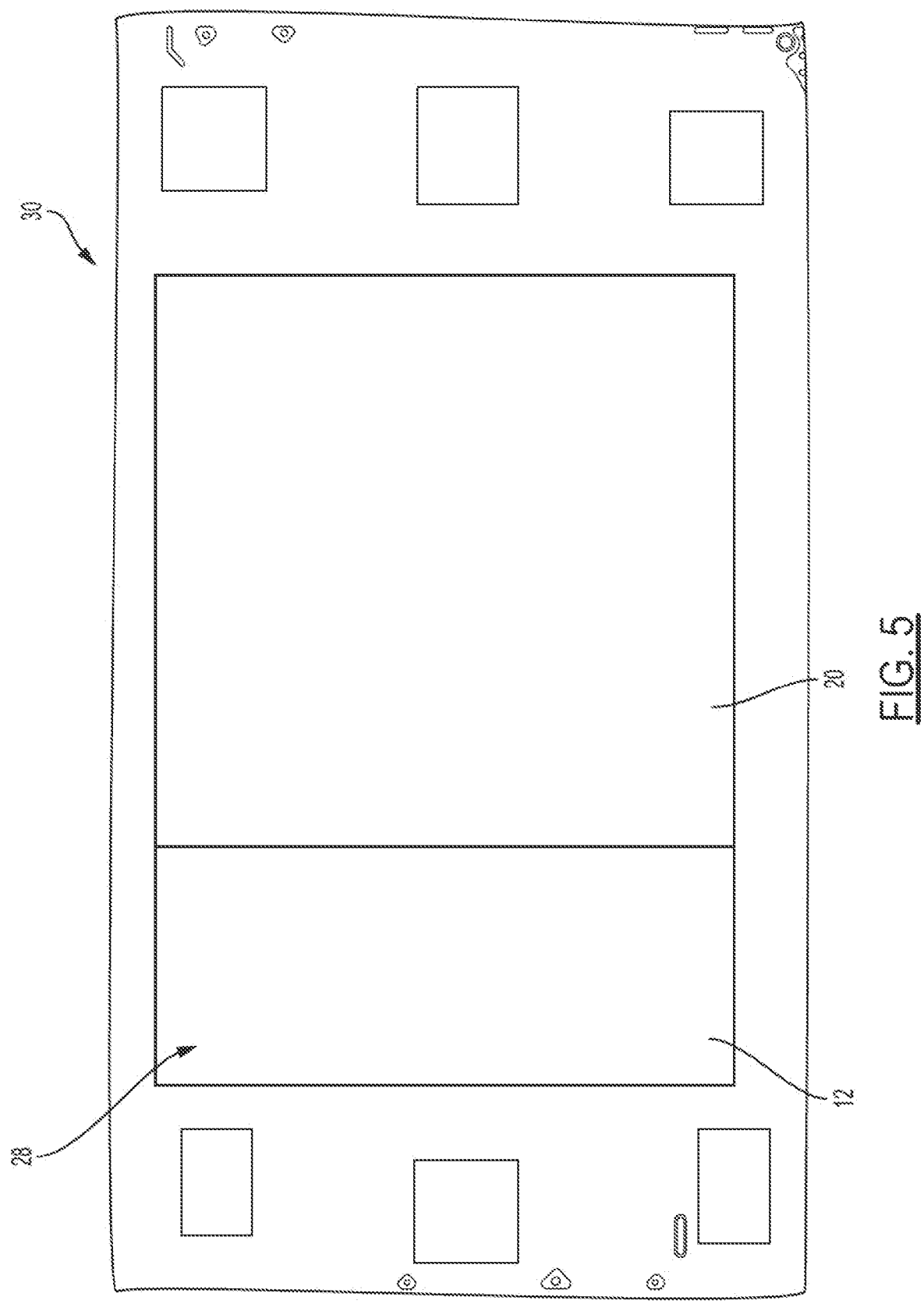
FIG. 5 is a diagram of a second example front view of a fuel cell with the integrated membrane electrode assembly disposed onto a first bipolar plate.

Accordingly, with reference to FIG. 3, the present disclosure provides an integrated fuel cell 10 having a WVT region which is internal to the fuel cell. The fuel cell 10 of the present disclosure includes a water transfer portion 12 which is integrated in the membrane electrode assembly 18. The integrated fuel cell 10 includes a first bipolar plate 14, a second bipolar plate 16, and a membrane electrode assembly (MEA) 18 disposed between the first and second bipolar plates 14, 16 as shown in FIG. 3. With reference to FIGS. 3-5, the membrane electrode assembly 18 further includes a water vapor transfer portion 12 and an active area portion 20 configured to generate electricity 62 and provide a water byproduct 22 upon facilitating a reaction involving an input stream with hydrogen 24 and input airstream 26 with oxygen. It is understood that all references to input airstream 26 should be interpreted to mean that input airstream 26 contains oxygen.

Referring again to FIG. 3, the water vapor transfer portion 12 of the membrane electrode assembly 18 may be hydrophilic relative to the active area portion 20 and is operatively configured to transfer moisture from a primary stream 23 of fluid with higher relative humidity (such as but not limited to output hydrogen stream 24') to a secondary stream 25 of fluid (such as but not limited to a input charged air 26 at first MEA end 28). Alternatively, water vapor transfer portion 12 at the second MEA end 30 may be configured to also transfer moisture from a primary stream 23 of fluid (exhaust airstream) 26' to a secondary stream 25 of fluid (input gaseous stream with hydrogen) 24. It is understood that the primary stream of fluid (exhaust airstream 26' or output hydrogen stream 24' or the like) is rich in moisture given that a water vapor byproduct results when the fuel cell generates electricity.

Figure 6A:
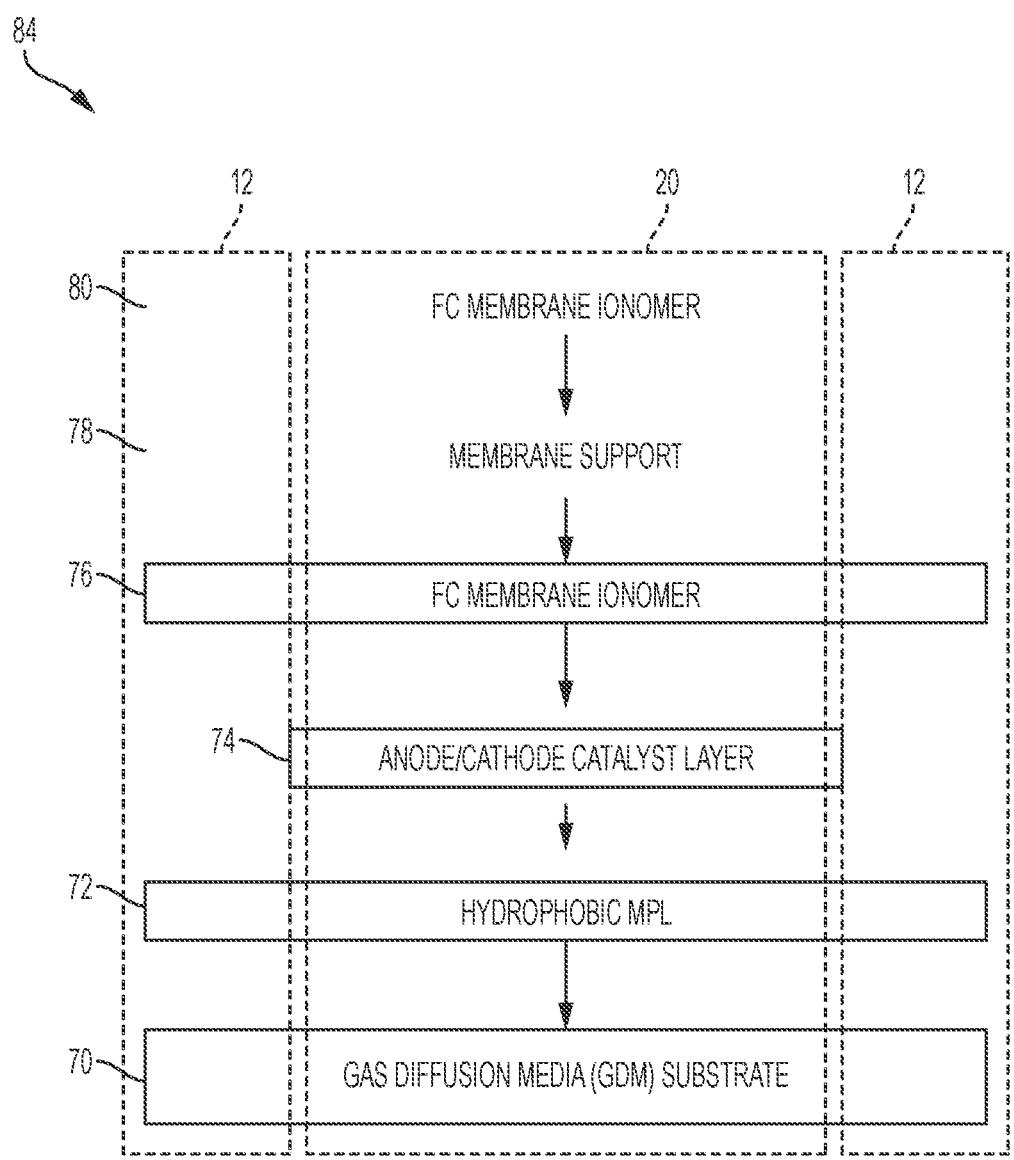
FIG. 6A is an expanded schematic view of a first embodiment of integrated water vapor transfer device and fuel cell.

The present disclosure also includes a method for manufacturing an integrated MEA. As shown in FIG. 6A, the method includes the steps of: (1) providing a substrate 70 having an active area (AA) region 20 and a water vapor transfer (WVT) region 12; (2) coating a hydrophobic microporous layer 72 across the substrate 70; (3) coating a catalyst layer (either anode or cathode) 74 onto the hydrophobic microporous layer 72 in the AA region 20; (4) coating a first fuel cell membrane ionomer layer 76 onto the catalyst layer in the AA region 20 and onto the hydrophobic microporous layer in the WVT region 12; (5) applying an optional membrane support layer 78 to the first fuel cell membrane ionomer layer 76 in the AA region 20 and the WVT region 12; (6) coating an optional second fuel cell membrane ionomer layer 80 onto the membrane support layer 78 thereby forming a coated substrate; and (7) assembling the coated substrate 84 to a companion coated substrate. It is understood that each layer may be heat treated before an additional layer is added—with the exception of the first fuel cell membrane ionomer layer 76 which may be wet when the membrane support layer 78 is applied to the first fuel cell membrane ionomer layer 76. Therefore, it is understood that the coated substrate may be formed upon applying the first fuel cell membrane ionomer layer. However, as another option, the membrane support layer may optionally be applied to the first fuel cell membrane ionomer layer thereby forming a coated substrate. Also, in yet a third option, the second fuel cell membrane ionomer may be applied on top of the membrane support layer thereby forming a coated substrate. In a fourth option, the second fuel cell membrane ionomer layer 80 may be applied directly to the first fuel cell membrane ionomer layer 76. The coated substrate formed by the substrate and a plurality of layers (identified above) may then be heat treated and assembled to the companion coated substrate.

In the first aforementioned arrangement, the coated substrate may be formed upon applying the first fuel cell membrane ionomer. Under this arrangement, the first fuel cell membrane ionomer layer may include a plurality of reinforcement material such as, but not limited to, short plastic or ceramic fibers. The short plastic and/or ceramic fibers may be mixed into the first fuel cell membrane ionomer solution and sent through die coating tool in order to apply the layer.

Figure 6B:
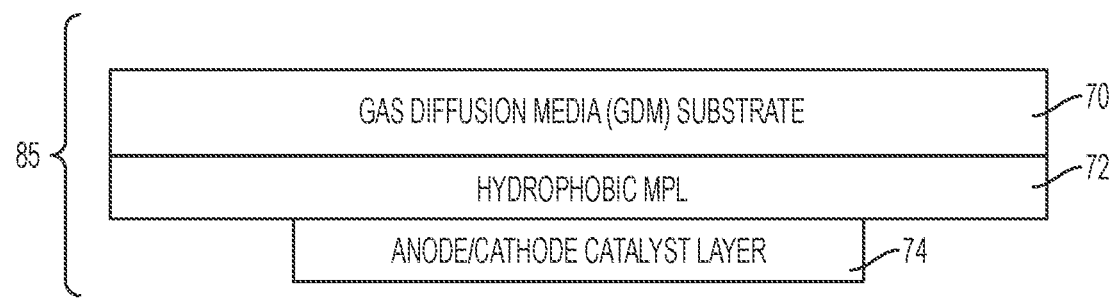
FIG. 6B is a schematic view of a first embodiment of a companion coated substrate which would be assembled to the coated substrate in FIG. 6A.

When the entire coated substrate 84 is assembled (as recited in steps 1-6 above), the coated substrate 84 may be heat treated (such that, in one non-limiting example, the second fuel cell membrane ionomer layer 80 is heat treated) before assembling the coated substrate 84 to a companion coated substrate 85 (shown in FIG. 6B). The companion coated substrate 85 includes a substrate 70, a hydrophobic microporous layer (MPL) and a catalyst layer 74. With respect to all embodiments of the present disclosure, the companion coated substrates 85, 85', and 85" may be formed by layers which are applied to the substrate 70 in a similar manner to the coated substrate 84 having the first fuel cell membrane ionomer layer 76 and then optionally adding a membrane support layer to form a coated substrate, and then as a third option, applying second fuel cell membrane ionomer layer 80 to form a coated substrate. In a fourth option, the second fuel cell membrane ionomer layer 80 may be applied directly to the first fuel cell membrane ionomer layer 76. The coated substrate formed by the substrate and a plurality of layers (identified above) may then be heat treated and assembled to the companion coated substrate.

With respect to all embodiments in the present disclosure, each coated layer may be applied via a die coating process wherein each layer (except for the membrane support layer) may be coated onto the substrate. The optional membrane support layer may, but not necessarily, consist of expanded Polytetrafluoroethylene (ePTFE). Moreover, with respect to all embodiments of the present disclosure, it is further understood that each layer (except perhaps the first membrane ionomer layer) which is coated onto the substrate may, but not necessarily, be heat treated before the next layer is applied.

With reference again to FIG. 6A, the AA region 20 (shown as element 20 in FIG. 6A) of the coated substrate 84 includes a substrate layer 70, the hydrophobic MPL layer 72, the catalyst layer 74, the first fuel cell membrane ionomer layer 76, an optional membrane support layer 78, and an optional second fuel cell membrane ionomer 80. The WVT region 12 of the coated substrate 84 includes a substrate layer 70, the hydrophobic MPL layer 72, the first fuel cell membrane ionomer layer 76, the membrane support layer 78, and the second fuel cell membrane ionomer 80. The membrane support layer 78 and the second fuel cell membrane ionomer layer 80 are shown in phantom to denote that these layers are optional. The WVT region 12 may be defined at a first end 28 of the substrate as shown in FIG. 5. Alternatively, the WVT region 12 may also be defined at the first end 28 and at the second end 30 of the substrate with the AA region 20 disposed therebetween—as shown in FIGS. 3 and 4.

Figure 7A:
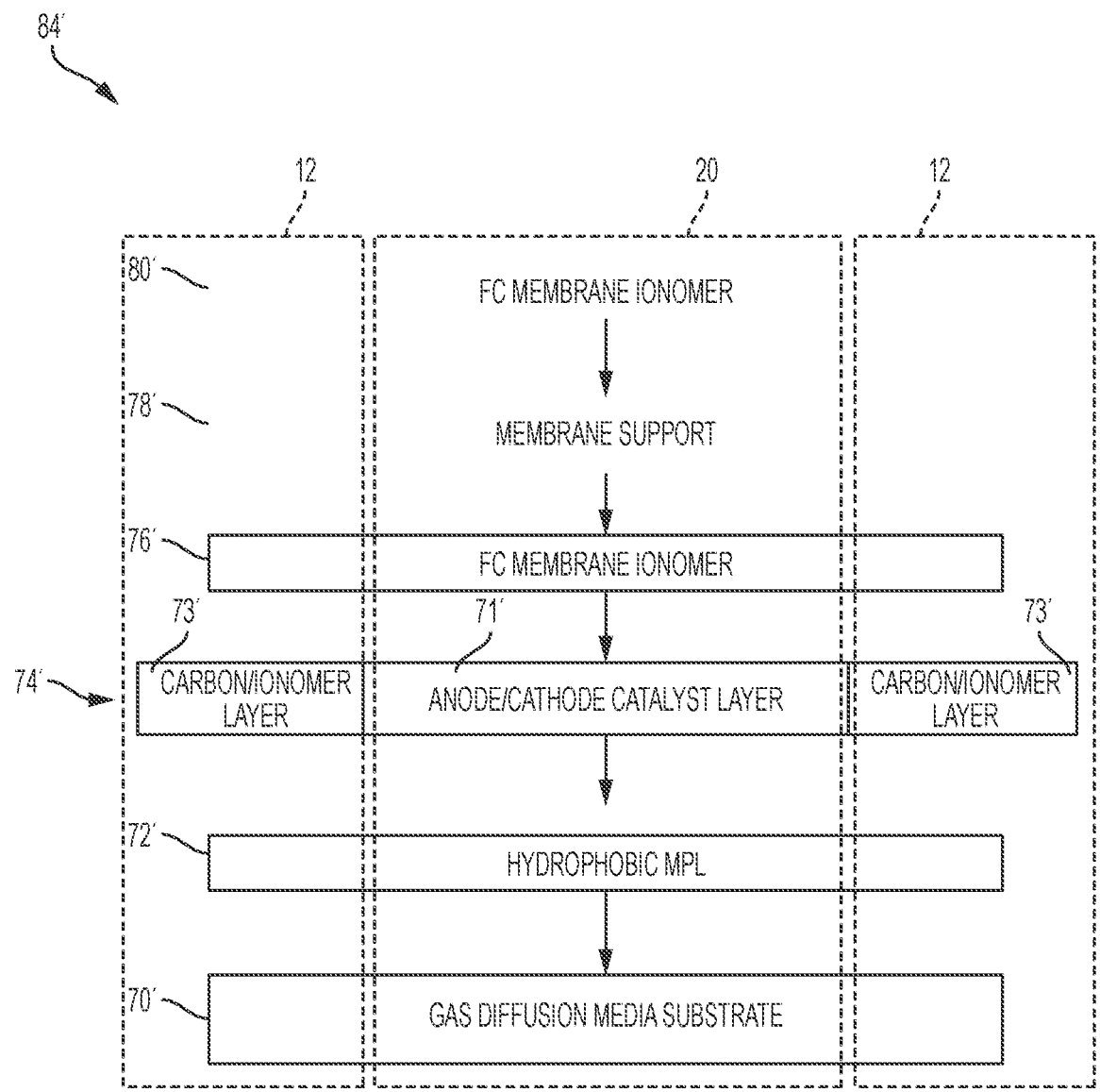
FIG. 7A is an expanded schematic view of a second embodiment of integrated water vapor transfer device and fuel cell.
Figure 7B:
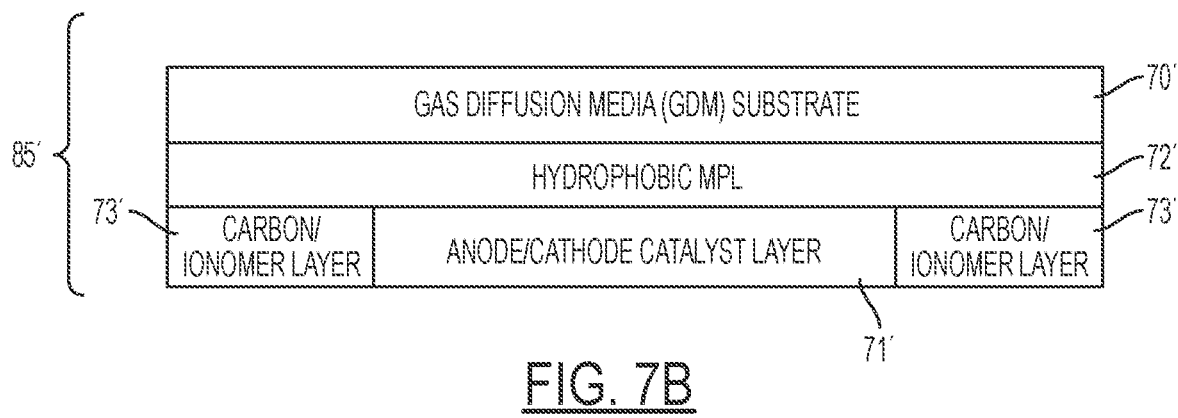
FIG. 7B is a schematic view of a second embodiment of the companion coated substrate which would be assembled to the coated substrate in FIG. 7A.

Referring now to FIG. 7A, another embodiment of the method of manufacturing a fuel cell having an integrated water vapor transfer region 12 may involve stripe coating certain layers of the fuel cell. In this embodiment, the manufacturing method includes the steps of: (1) providing a substrate 70' having an AA region 20 and a WVT region 12; (2) coating a hydrophobic microporous layer 72' across the substrate 70'; (3) stripe coating a hybrid layer 74' wherein a catalyst layer 71' is coated onto the hydrophobic microporous layer 72' in the AA region 20 and a mixed/carbon ionomer layer 73' is coated onto the hydrophobic microporous layer 72' in the WVT region 12; (4) coating a first fuel cell membrane ionomer layer 76' onto the catalyst layer 71' in the AA region 20 and onto the carbon ionomer layer 73' in the WVT region 12; (5) applying an optional membrane support layer 78' to the first fuel cell membrane ionomer layer 76' in the AA region 20 and the WVT region 12; (6) coating an optional second fuel cell membrane ionomer layer 80' onto the membrane support layer 78' thereby forming a coated substrate 84'; and (7) assembling the coated substrate 84' to a companion coated substrate 85' (shown in FIG. 7B). Similar to the previous embodiment, it is understood that the coated substrate may be formed upon applying the first fuel cell membrane ionomer layer. However, as another option, the membrane support layer may be applied to the first fuel cell membrane ionomer layer thereby forming a coated substrate. Also, in yet a third option, the second fuel cell membrane ionomer may be applied on top of the membrane support layer thereby forming a coated substrate. In a fourth option, the second fuel cell membrane ionomer may be applied on top of the first fuel cell membrane ionomer layer. Regardless of which embodiment is implemented from the above four options, the coated substrate 84' of the aforementioned method may be heat treated before assembling the coated substrate 84' to a companion coated substrate 85'.

In the first aforementioned arrangement, the coated substrate may be formed upon applying the first fuel cell membrane ionomer. Under this arrangement, the first fuel cell membrane ionomer layer may include a plurality of reinforcement material such as, but not limited to, short plastic or ceramic fibers. The short plastic and/or ceramic fibers may be mixed into the first fuel cell membrane ionomer solution and sent through die coating tool in order to apply the layer.

As shown in FIG. 7A, the AA region 20 of the coated substrate 84' includes a substrate layer 70', the hydrophobic MPL layer 72', the catalyst layer 71", the first fuel cell membrane ionomer layer 76', the optional membrane support layer 78', and the optional second fuel cell membrane ionomer 80'. In contrast, the WVT region 12 of the coated substrate 84' includes a substrate layer 70', the hydrophobic MPL layer 72', the carbon/ionomer layer 73', the first fuel cell membrane ionomer layer 76', the membrane support layer 78', and the second fuel cell membrane ionomer 80'. The WVT region 12 of the aforementioned embodiment may be defined at a first end 28 (FIG. 5) of the coated substrate 84' with the AA region 20 defined across the remainder of the coated substrate 84' as shown in FIG. 5. Alternatively, as shown in FIG. 4, the WVT region 12 of the aforementioned embodiment may be defined at the first end 28 and at a second end 30 of the coated substrate with the AA region 20 disposed therebetween.

Figure 8A:
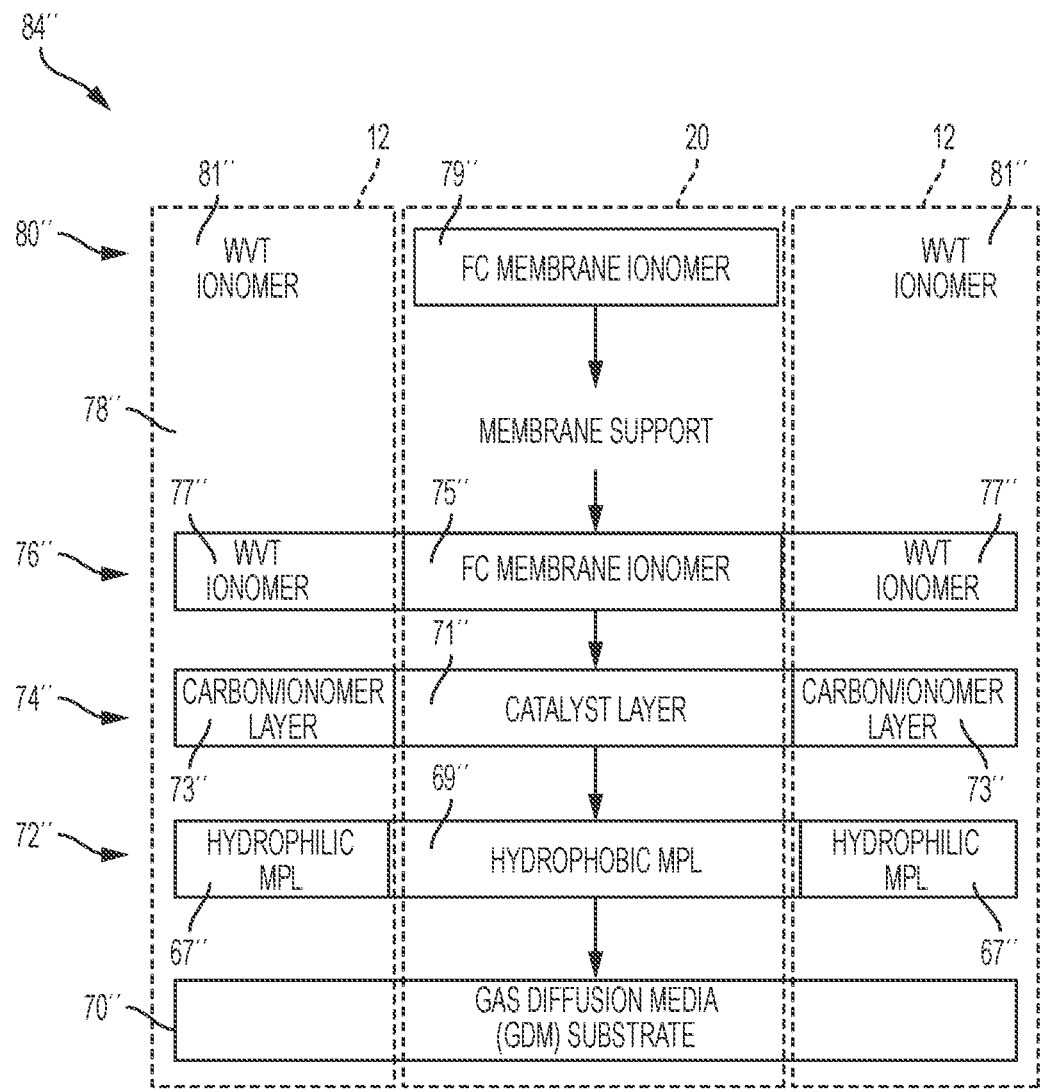
FIG. 8A is an expanded schematic view of a third embodiment of integrated water vapor transfer device and fuel cell.
Figure 8B:
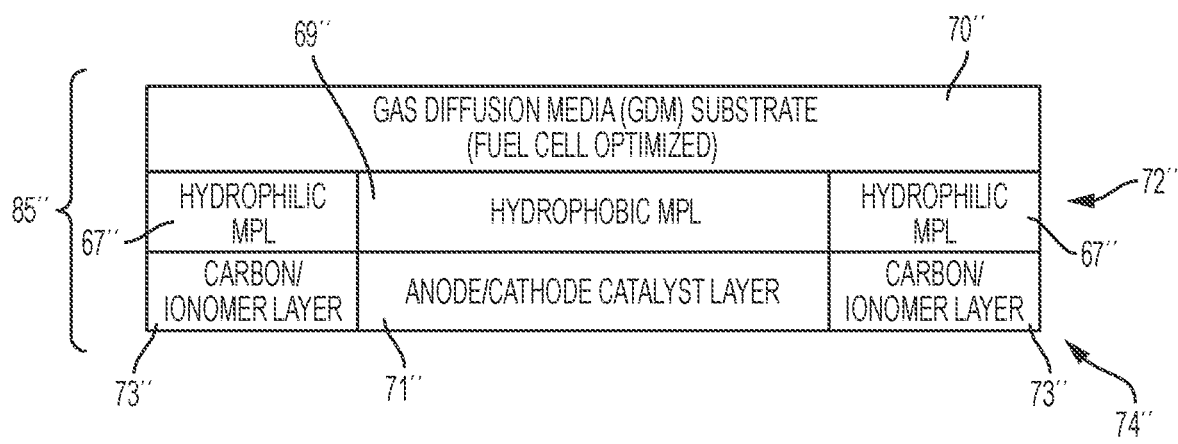
FIG. 8B is a schematic view of a third embodiment of the companion coated substrate which would be assembled to the coated substrate in FIG. 8A.

Referring now to FIG. 8A, another embodiment of the method of manufacturing method is provided wherein multiple layers of the coated substrate 84" are stripe coated. In this embodiment, the manufacturing method includes the steps of: (1) providing a substrate 70" having an AA region 20 and a WVT region 12; (2) stripe coating a hybrid layer 72" wherein a hydrophobic microporous layer 69" is coated in the AA region 20 and a hydrophilic microporous layer 67" is coated in the WVT region 12; (3) stripe coating another hybrid layer 74" wherein a catalyst layer 71" is coated onto the hydrophobic microporous layer 69" in the AA region 20 and a carbon/ionomer layer 73" is coated onto the hydrophilic layer 67" in the WVT region 12; (4) stripe coating yet another hybrid layer 76" wherein a first fuel cell membrane ionomer layer 75" is coated onto the catalyst layer 71" in the AA region 20 and a first WVT ionomer 77" is coated onto the carbon ionomer layer 73" in the WVT region 12; (5) optionally applying a membrane support layer 78" onto the first fuel cell membrane ionomer 75" (in the AA region 20) and the first WVT ionomer 77" (in the WVT region 12); (6) stripe coating another hybrid layer 80" wherein the second fuel cell membrane ionomer layer 79" is coated onto the membrane support layer 78" in the AA region 20 and in WVT region 12 thereby forming a coated substrate 84"; and (7) assembling the coated substrate 84" to a companion coated substrate 85". The substrate 70" may be a gas diffusion media. Moreover, the coated substrate 84" of the aforementioned manufacturing method may be heat treated assembling the coated substrate 84" to a companion coated substrate 85" (shown in FIG. 8B). Therefore, it is understood that the coated substrate may be formed upon applying the first fuel cell membrane ionomer layer. However, as another option, the membrane support layer may optionally be applied to the first fuel cell membrane ionomer layer thereby forming a coated substrate. Also, in yet a third option, the second fuel cell membrane ionomer may be applied on top of the membrane support layer thereby forming a coated substrate. In a fourth option, the second fuel cell membrane ionomer layer 80" may be applied directly to the first fuel cell membrane ionomer layer 76". The coated substrate formed by the substrate and a plurality of layers (identified above) may then be heat treated and assembled to the companion coated substrate.

In the first aforementioned optional arrangement, the coated substrate may be formed upon applying the first fuel cell membrane ionomer. Under this arrangement, the first fuel cell membrane ionomer layer may include a plurality of reinforcement material such as, but not limited to, short plastic or ceramic fibers. The short plastic and/or ceramic fibers may be mixed into the first fuel cell membrane ionomer solution and sent through die coating tool in order to apply the layer.

Referring again to FIG. 8A, the AA region 20 of the coated substrate 84" may include a substrate 70" layer, the hydrophobic MPL layer 69", the catalyst layer 71", the first fuel cell membrane ionomer layer 75", the membrane support layer 78", and the second fuel cell membrane ionomer 79". In contrast, the WVT region 12 of the coated substrate 84" includes a substrate layer 70", the hydrophilic MPL layer 67", the carbon/ionomer layer 73", the first WVT ionomer layer 77", the membrane support layer 78", and the second WVT ionomer layer 81". Referring again to FIG. 5, the WVT region 12 of the aforementioned embodiment may be defined at a first end 28 of the coated substrate and the AA region 20 may be defined across the remainder of the coated substrate 84". With reference again to FIG. 4, the WVT region 12 of the aforementioned embodiment may alternatively be defined at the first end 28 and at a second end 30 of the coated substrate with the AA region 20 disposed therebetween.

Figure 9:
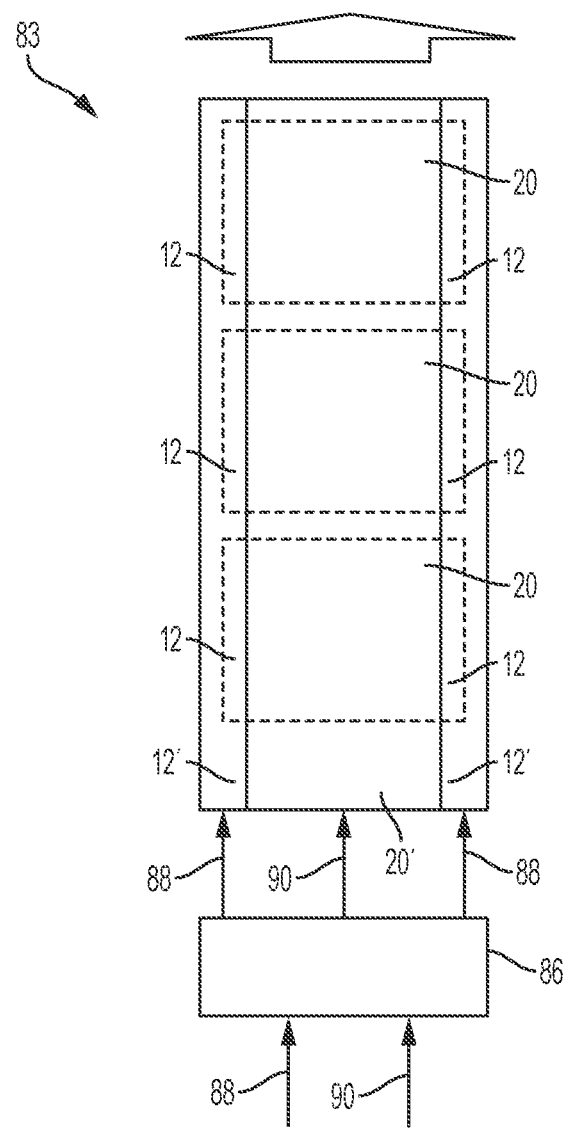
FIG. 9 depicts an example, non-limiting stripe coating step according to the present disclosure wherein the substrate is illustrated in a plan view.

With reference to FIG. 9, the stripe coating step of the various embodiments is shown wherein a die coating tool 86 accepts WVT solution 88 as well as AA solution 90. WVT solution may be any of the aforementioned solutions/layers which are dedicated to the WVT region 12' of the substrate roll 83 during a stripe coating step. AA solution may be any of the aforementioned solutions/layers which are dedicated to the AA region 20' of the substrate roll 83 during a stripe coating step. As shown in FIG. 9, the die coating machine 86 is configured to distribute the aforementioned solutions to their dedicated regions as shown as the substrate roll moves away from the die coating tool.

While at least three exemplary embodiments have been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A method for manufacturing an integrated membrane electrode assembly (MEA), the method comprising:
    providing a substrate having an active area (AA) portion and a water vapor transfer (WVT) portion;
    coating a hydrophobic microporous layer (MPL) across the substrate;
    stripe coating a catalyst layer onto the hydrophobic microporous layer in the AA portion and a mixed carbon/ionomer layer in the WVT portion;
    coating a first fuel cell membrane ionomer layer onto the catalyst layer in the AA portion and onto the mixed carbon/ionomer layer in the WVT portion to form a coated substrate with an AA region and a WVT region;
    heat treating the coated substrate; and
    assembling the coated substrate to a companion coated substrate.

2. The method of claim 1, further comprising applying a membrane support layer to the first fuel cell membrane ionomer layer.

3. The method of claim 2, further comprising coating a second fuel cell membrane ionomer layer to the membrane support layer to thereby form the coated substrate.

4. The method of claim 2, wherein the membrane support layer is formed from an expanded polytetrafluoroethylene (ePTFE).

5. The method of claim 1, wherein the coated substrate is heat-treated before assembling the coated substrate to the companion coated substrate.

6. The method of claim 1, wherein the AA region of the coated substrate includes at least the substrate, the hydrophobic MPL, the catalyst layer, and the first fuel cell membrane ionomer layer.

7. The method of claim 1, wherein the WVT region of the coated substrate includes at least the substrate, the hydrophobic MPL, the mixed carbon/ionomer layer, and the first fuel cell membrane ionomer layer.

8. The method of claim 1, wherein the WVT region is defined at a first end of the substrate.

9. The method of claim 8, wherein the WVT region is defined at the first end of the substrate and at a second end of the substrate with the AA region disposed therebetween.

10. The method of claim 1, wherein coating the hydrophobic microporous layer across the substrate includes stripe coating the hydrophobic microporous layer in the AA portion, and wherein coating the first fuel cell membrane ionomer layer onto the catalyst layer includes stripe coating the first fuel cell membrane ionomer layer onto the catalyst layer in the AA portion.

11. The method of claim 10, further comprising stripe coating a hydrophilic microporous layer onto the WVT portion.

12. The method of claim 11, further comprising stripe coating a first WVT ionomer onto the mixed carbon/ionomer layer in the WVT portion.

13. The method of claim 12, wherein the coated substrate is heat-treated before assembling the coated substrate to the companion coated substrate.

14. The method of claim 12, wherein the AA region of the coated substrate includes at least the substrate, the hydrophobic MPL, the catalyst layer, and the first fuel cell membrane ionomer layer.

15. The method of claim 12, wherein the WVT region of the coated substrate includes at least the substrate, the hydrophilic MPL, the mixed carbon/ionomer layer, and the first WVT ionomer.

16. The method of claim 12, wherein the WVT region is defined at a first end of the substrate.

17. The method of claim 16, wherein the WVT region is defined at the first end of the substrate and at a second end of the substrate with the AA region disposed therebetween.

18. The method of claim 1, further comprising:
    attaching a first bipolar plate to a first side of the integrated MEA formed, at least in part, by assembling the coated substrate to the companion coated substrate; and
    attaching a second bipolar plate to a second side of the integrated MEA opposite the first side.

19. The method of claim 1, wherein the catalyst layer is stripe coated onto the hydrophobic MPL in only the AA region, and wherein the mixed carbon/ionomer layer is stripe coated onto the hydrophobic MPL in only in the WVT region.

20. The method of claim 1, wherein the WVT region includes first and second discrete WVT portions sandwiching therebetween the AA region.

21. The method of claim 1, wherein the substrate includes a gas diffusion media.

22. The method of claim 21, wherein the gas diffusion media includes a non-woven carbon fiber paper or a woven carbon cloth.

23. The method of claim 1, wherein the hydrophobic MPL is located directly against the substrate, the catalyst layer is located directly against the hydrophobic MPL, the mixed carbon/ionomer layer is located directly against the hydrophobic MPL, and the first fuel cell membrane ionomer layer is located directly against the catalyst layer and the mixed carbon/ionomer layer.

24. The method of claim 1, wherein the companion coated substrate includes a second substrate coated with a second hydrophobic MPL and a second catalyst layer.

25. The method of claim 24, wherein the second hydrophobic MPL is located directly against the second substrate, and the second catalyst layer is located directly against the second hydrophobic MPL.

* * * * *